US009589895B2

(12) United States Patent
Bazan et al.

(10) Patent No.: US 9,589,895 B2
(45) Date of Patent: Mar. 7, 2017

(54) WHOLE WAFER EDGE SEAL

(71) Applicant: International Business Machines Corporation, Armonk, NY (US)

(72) Inventors: Gregory Bazan, Essex Junction, VT (US); Thomas F. Houghton, Marlboro, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1 day.

(21) Appl. No.: 14/686,904

(22) Filed: Apr. 15, 2015

(65) Prior Publication Data

US 2016/0307848 A1    Oct. 20, 2016

(51) Int. Cl.
| | | |
|---|---|---|
| *H01L 23/544* | (2006.01) | |
| *H01L 23/06* | (2006.01) | |
| *H01L 23/58* | (2006.01) | |
| *H01L 21/4763* | (2006.01) | |
| *H01L 21/44* | (2006.01) | |
| *H01L 23/532* | (2006.01) | |
| *H01L 21/02* | (2006.01) | |
| *H01L 21/768* | (2006.01) | |
| *H01L 23/00* | (2006.01) | |

(52) U.S. Cl.
CPC .. *H01L 23/53238* (2013.01); *H01L 21/02021* (2013.01); *H01L 21/7685* (2013.01); *H01L 21/76829* (2013.01); *H01L 23/564* (2013.01)

(58) Field of Classification Search
CPC ......... H01L 23/53238; H01L 21/02021; H01L 23/564; H01L 21/76829; H01L 21/7685

USPC .................................................. 257/610–628
See application file for complete search history.

(56) References Cited

U.S. PATENT DOCUMENTS

| | | | |
|---|---|---|---|
| 5,593,925 A | * | 1/1997 | Yamaha ............ H01L 21/31116 |
| | | | 148/DIG. 28 |
| 5,723,385 A | | 3/1998 | Shen et al. |
| 5,969,408 A | * | 10/1999 | Perelli ................. H01L 23/3171 |
| | | | 257/620 |
| 6,261,945 B1 | | 7/2001 | Nye, III et al. |
| 6,365,958 B1 | | 4/2002 | Ibnabdeljalil et al. |
| 7,098,676 B2 | | 8/2006 | Landers et al. |
| 7,741,715 B2 | | 6/2010 | Kim et al. |

(Continued)

*Primary Examiner* — Marcos D Pizarro
*Assistant Examiner* — Nelson Garces
(74) *Attorney, Agent, or Firm* — Yuanmin Cai; Andrew M. Calderon; Roberts Mlotkowski Safran Cole & Calderon, P.C.

(57) ABSTRACT

The present invention relates generally to semiconductor devices and more particularly, to a structure and method of creating a non-permeable edge seal around a whole wafer. The edge seal may be located between an inner region of a wafer comprising product chips and an outer edge of the wafer. The edge seal may comprise a fillet region adjacent the inner region, and a dielectric extension adjacent the fillet region. The dielectric extension region may be impermeable to moisture and composed of a dielectric layer on the wafer and a capping layer on the dielectric layer. The fillet region may comprise a lower metal fillet directly on the wafer, a dielectric layer on the lower metal fillet, an upper metal fillet on the dielectric layer, and a capping layer on the upper metal fillet. The fillet region may be adjacent to and in contact with a permeable layer formed on the product region.

7 Claims, 18 Drawing Sheets

(56) References Cited

U.S. PATENT DOCUMENTS

| | | | |
|---|---|---|---|
| 7,939,913 B2 * | 5/2011 | Watanabe | H01L 23/3192 |
| | | | 257/618 |
| 8,048,761 B2 | 11/2011 | Yeo et al. | |
| 2005/0170641 A1 * | 8/2005 | Kondo | H01L 21/7684 |
| | | | 438/633 |
| 2011/0115058 A1 | 5/2011 | Mieczkowski et al. | |
| 2011/0193197 A1 | 8/2011 | Farooq et al. | |
| 2012/0133046 A1 | 5/2012 | Chien et al. | |

* cited by examiner

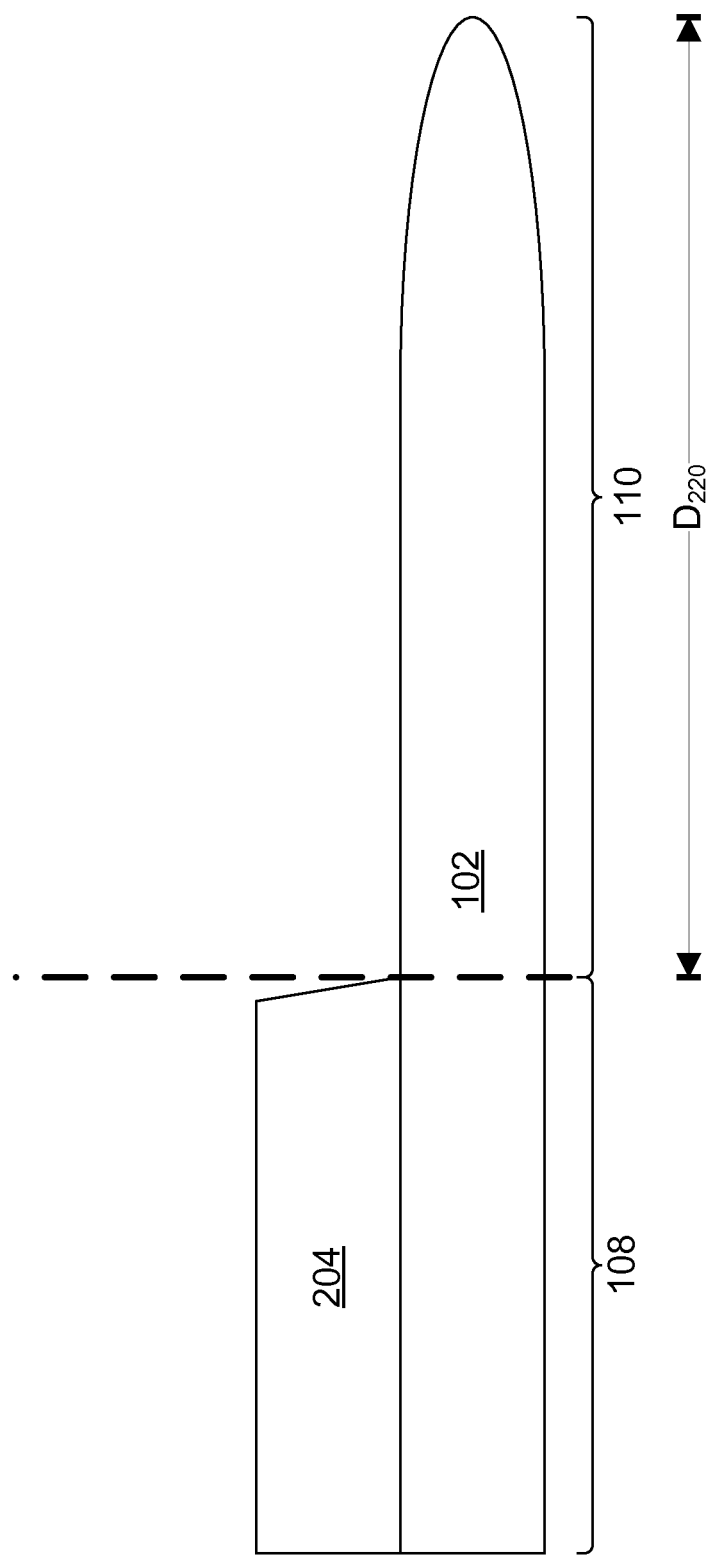

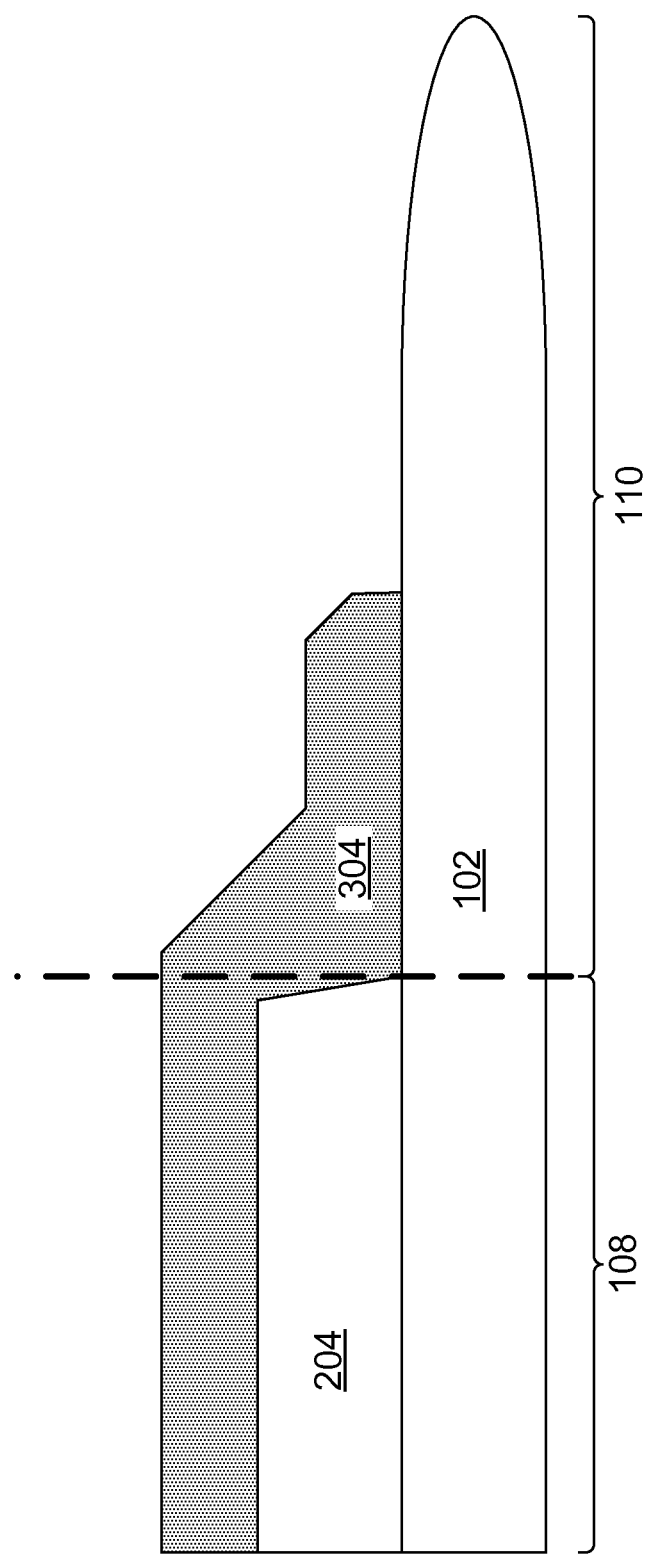

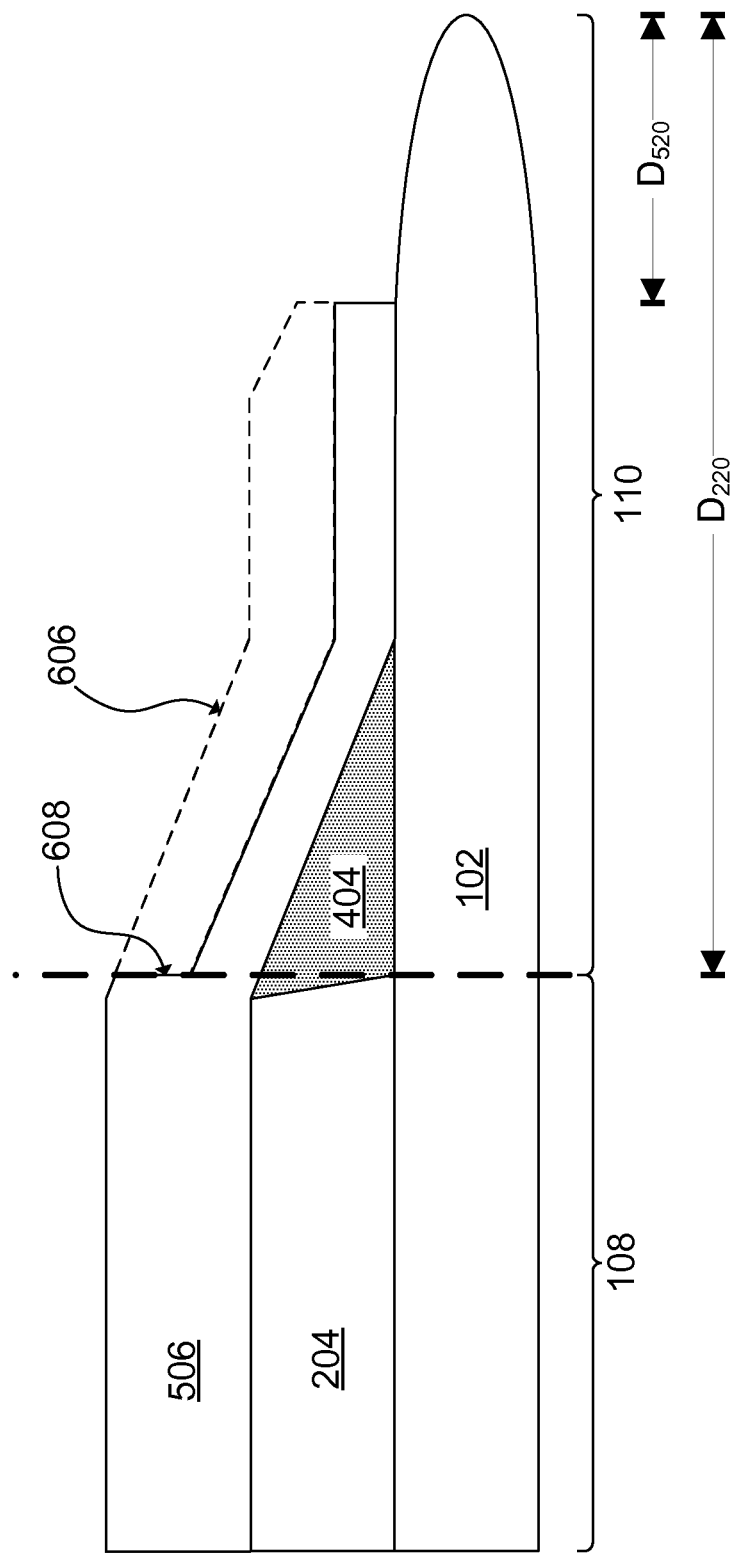

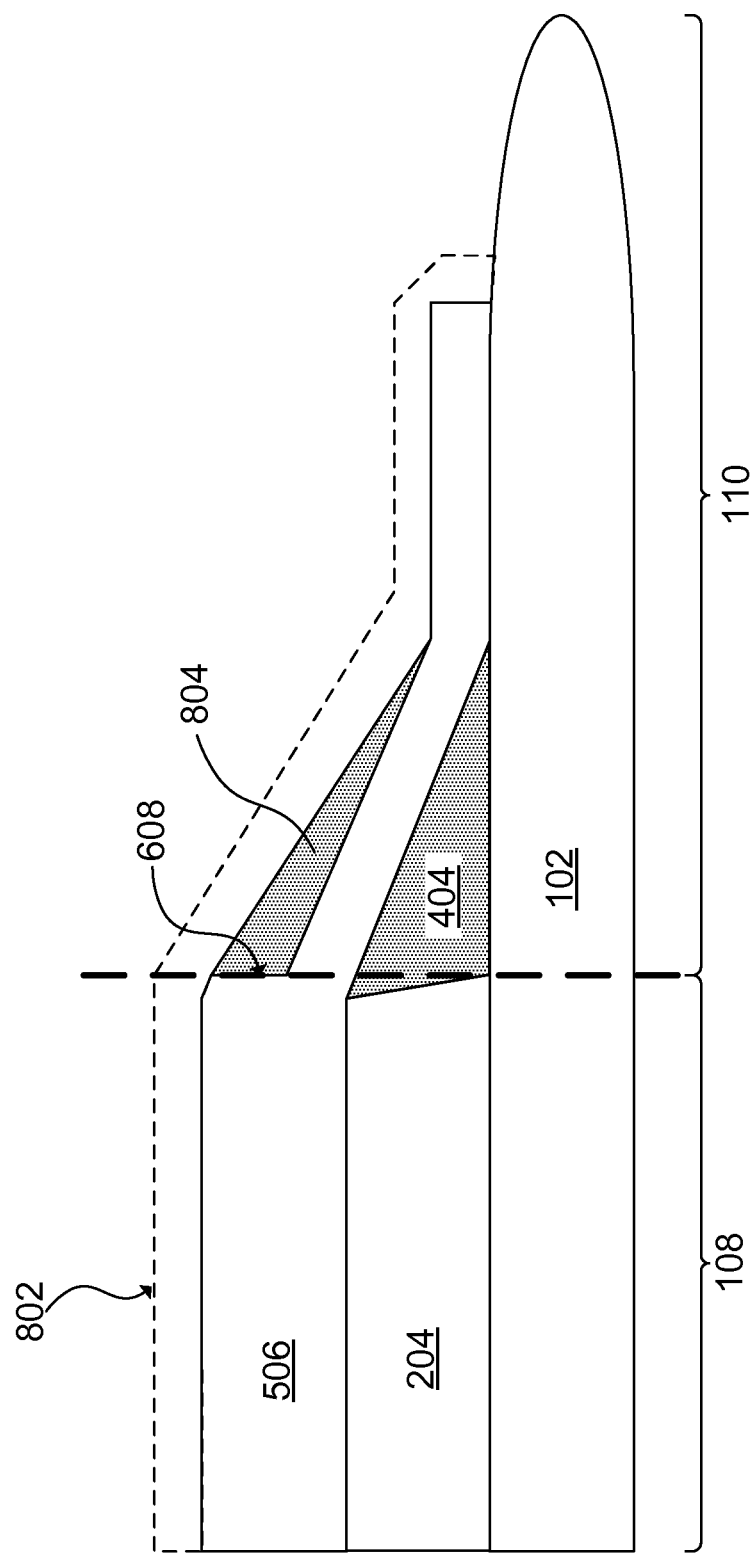

WHOLE WAFER EDGE SEAL

BACKGROUND

The present invention relates generally to semiconductors and, more particularly, to a structure and method of creating a moisture barrier edge seal around an entire circumference of a whole wafer.

Microelectronic integrated circuits may connect devices together using copper interconnect "wires" formed in layers of insulator films. Wiring levels may use insulator films which may be permeable to water vapor. Water vapor will degrade the performance of the permeable insulator layers and possibly corrode the metal structures embedded within the permeable insulator layers. Because microelectronic devices are patterned at the chip level, a moisture barrier is typically formed around the lower levels of each individual chip during manufacturing.

Although conventional chip sealing methods may work to protect individual chips, they may not provide sufficient protection when the whole wafer itself is contemplated as one large interconnected circuit composed of a plurality of individual chips in a product region. When the objective is to produce a whole wafer wherein a plurality of separate chips are intentionally interconnected by design, a conventional chip sealing method does not suffice to protect the wafer from moisture because on a whole wafer each layer reaches the edge of the wafer without a sufficient moisture barrier. Therefore, a need to provide a whole wafer edge seal is needed.

SUMMARY

According to an embodiment, a method is disclosed. The method may include: forming a permeable layer on the product region of the wafer, wherein an outer edge of the permeable layer is spaced a first distance from an outer edge of the wafer; forming a lower metal fillet on the wafer laterally adjacent to and in contact with the permeable layer, wherein an outer edge of the lower metal fillet is spaced a second distance from the outer edge of the wafer, wherein the second distance is smaller than the first distance; forming a non-permeable dielectric layer on the permeable layer, on the lower metal fillet, and on an outer region of the wafer adjacent to the lower metal fillet, wherein the an outer edge of dielectric layer is spaced a third distance from the outer edge of the wafer, and wherein the third distance is smaller than the second distance; forming an upper metal fillet on the dielectric layer, wherein the an outer edge of upper metal fillet is vertically aligned with an outer edge of the lower metal fillet such that the outer edge of the upper metal fillet is the second distance from the outer edge of the wafer; and forming a capping layer on the dielectric layer and the upper metal fillet, wherein an outer edge of the capping layer is vertically aligned with the outer edge of the dielectric layer such that the outer edge of the capping layer is spaced the third distance from the outer edge of the wafer.

According to an embodiment, another method is disclosed. The method may include: forming a product region on the wafer, wherein the product region comprises a permeable layer directly on the wafer, an inner portion of a non-permeable dielectric layer on the permeable layer, and an inner portion of a capping layer on the inner portion of the dielectric layer; forming a fillet region on the wafer adjacent to and contacting an outer edge of the product region, wherein the fillet region comprises a lower metal fillet directly on the wafer, a middle portion of the dielectric layer on the lower metal fillet, an upper metal fillet on the middle portion of the dielectric layer, and a middle portion of the capping layer on the upper metal fillet, wherein the upper metal fillet is vertically aligned with the lower metal fillet; and forming a dielectric extension region on the wafer adjacent to and contacting an outer edge of the fillet region, wherein the dielectric extension region comprises an outer portion of the dielectric layer directly on the wafer and an outer portion of the capping layer on the dielectric layer, and wherein the dielectric extension region has an outer edge that is a distance from an outer edge of the wafer.

According to an embodiment, a structure is disclosed. The structure may include: a permeable layer on a product area of the wafer, wherein an outer edge of the permeable layer is spaced a first distance from an outer edge of the wafer; a lower metal fillet on the wafer laterally adjacent to an in contact with the permeable layer, wherein an outer edge of the lower metal fillet is spaced a second distance from the outer edge of the wafer, wherein the second distance is smaller than the first distance; a non-permeable dielectric layer on the permeable layer, on the lower metal fillet, and on an outer region of the wafer adjacent to the lower metal fillet, wherein an outer edge of the dielectric layer is spaced a third distance from the outer edge of the wafer, and wherein the third distance is smaller than the second distance; an upper metal fillet on the dielectric layer, wherein an outer edge of the upper metal fillet is vertically aligned with an outer edge of the lower metal fillet such that the outer edge the upper metal fillet is the second distance from the outer edge of the wafer; and a capping layer on the dielectric layer and the upper metal fillet, wherein the capping layer has an outer edge that is vertically aligned with the outer edge of the dielectric layer such that the outer edge of the capping layer is the third distance from the outer edge of the wafer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

FIGS. 2A-2B are a cross section view and a top view, respectively, of forming a permeable layer, according to an embodiment of the present invention.

FIGS. 3A-3B are a cross section view and a top view, respectively, of forming a lower metal layer, according to an embodiment of the present invention.

FIGS. 6A-6B are a cross section view and a top view, respectively, of removing a portion of the dielectric layer, according to an embodiment of the present invention.

FIGS. 8A-8B are a cross section view and a top view, respectively, of forming an upper metal fillet, according to an embodiment of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
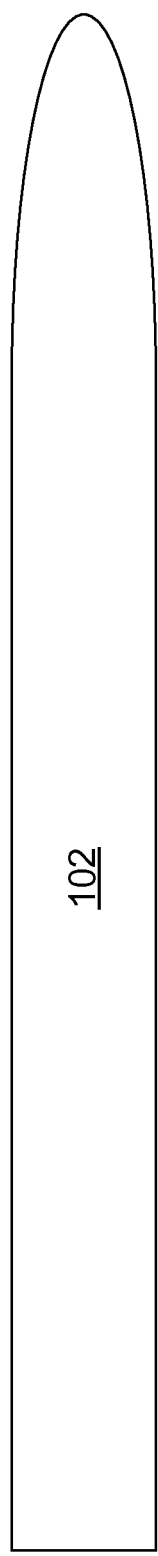
FIGS. 1A-B are a cross section view and a top view, respectively, of a wafer, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer or region is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

For purposes of the description hereinafter, the terms "outer," "outermost," and derivatives thereof shall relate to the side, portion, or region of an element such as a layer closest to an outer edge of a wafer. The terms "inner," "innermost," and derivatives thereof shall relate to the side, portion, or region of an element such as a layer closest to a center of the wafer. In other word, the terms "inner," "innermost," and derivatives thereof shall relate to a side, portion, or region of an element that is further from the edge of the wafer than a side, portion, or region of an element that is described as "outer," "outermost," and derivatives thereof. The terms "device level" or "device region" may include the wafer itself or levels formed on the wafer that may include wiring levels formed therein.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally semiconductors, and more particularly, to a structure and method of forming a moisture barrier edge seal around an entire circumference of a whole wafer thereby encircling an inner region of the wafer containing functioning devices. Conventional sealing technology may protect individual chips formed on a wafer from moisture. In typical wafer manufacturing, each chip is patterned individually using a mask which is stepped across the wafer chip by chip. Thus, the pattern can include a feature which is used to create a perimeter around each individual chip. The perimeter of each chip may serve as a moisture barrier once the wafer is diced (cut) into individual chips.

However, sealing a large wafer, composed of an array of interconnected individual chips, is more challenging than sealing a small chip. Conventional chip sealing methods may not be effective at sealing a whole wafer because the masks used to create the barrier are at the chip level rather than the wafer level. Furthermore, in conventional fabrication processes, partial chips are printed at the edges of the wafer, thus there is no seal on their exposed edges. Embodiments of the present invention provide a structure and method of forming an edge seal that may more effectively protect a whole wafer from moisture than conventional chip sealing technology. Methods of forming a whole wafer edge seal to prevent moisture intrusion, and the resulting structures, are described below in detail with reference to FIGS. 1A-9B.

Figure 1B:
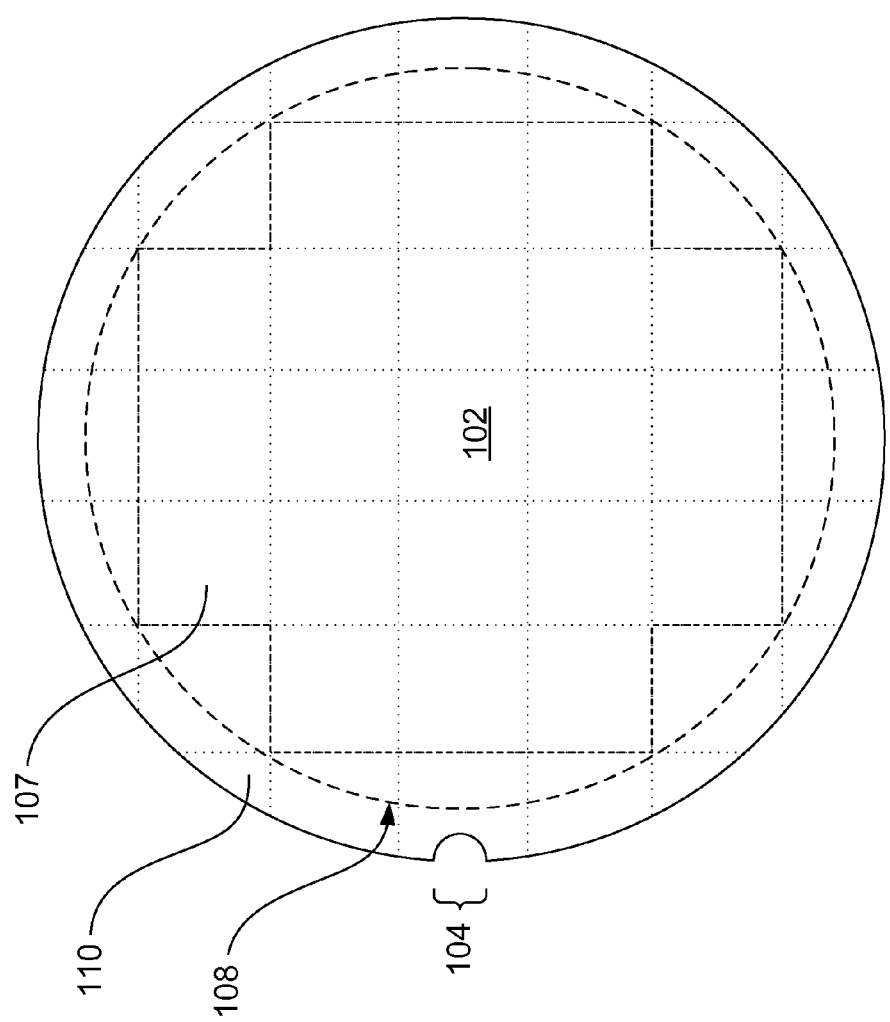

Referring now to FIGS. 1A-1B, a cross section view and a top view, respectively, illustrating a wafer 102 is shown. The wafer 102 may be composed of any semiconductor material known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. The wafer 102 may include one or more layers, such as, for example, a bulk substrate layer, a buried insulator layer, and an upper semiconductor layer. The buried insulator layer may comprise a dielectric material, by way of example, but not limitation, silicon dioxide. The wafer 102 may include one or more electrical devices formed thereon, such as, for example, a capacitor, a switch, an inductor, a resistor, a battery, a diode, a transistor, a transducer, a photosensor, a photovoltaic cell, a thyristor, or any combination of electrical devices. The wafer 102 may include a wafer notch 104. The wafer notch 104 (not to scale) may be used during fabrication to indicate a crystallographic plane of the wafer 102 or to orient the wafer during the manufacturing process. The wafer 102 may include a plurality of individual chips 106, which may either be whole chips or partial chips. Whole chips may be within a product region 107 located within an inner region 108 of the wafer 102. Partial chips may be located in an outer region 110 of the wafer 102 as well as the inner region 108. The inner region 108 may contain full chips in a product region 107 and one or more partial chips adjacent to an outer side of the product region 107. The outer region 110 may also comprise one or more partial chips. Partial chips are bounded by the product region 107 containing full chips and an outer edge of the wafer 102. It should be noted that while the wafer 102 is being described in these embodiments, wafers composed of other materials and shapes, such as, for example, rectangular glass substrates may also use be used.

Figure 2B:
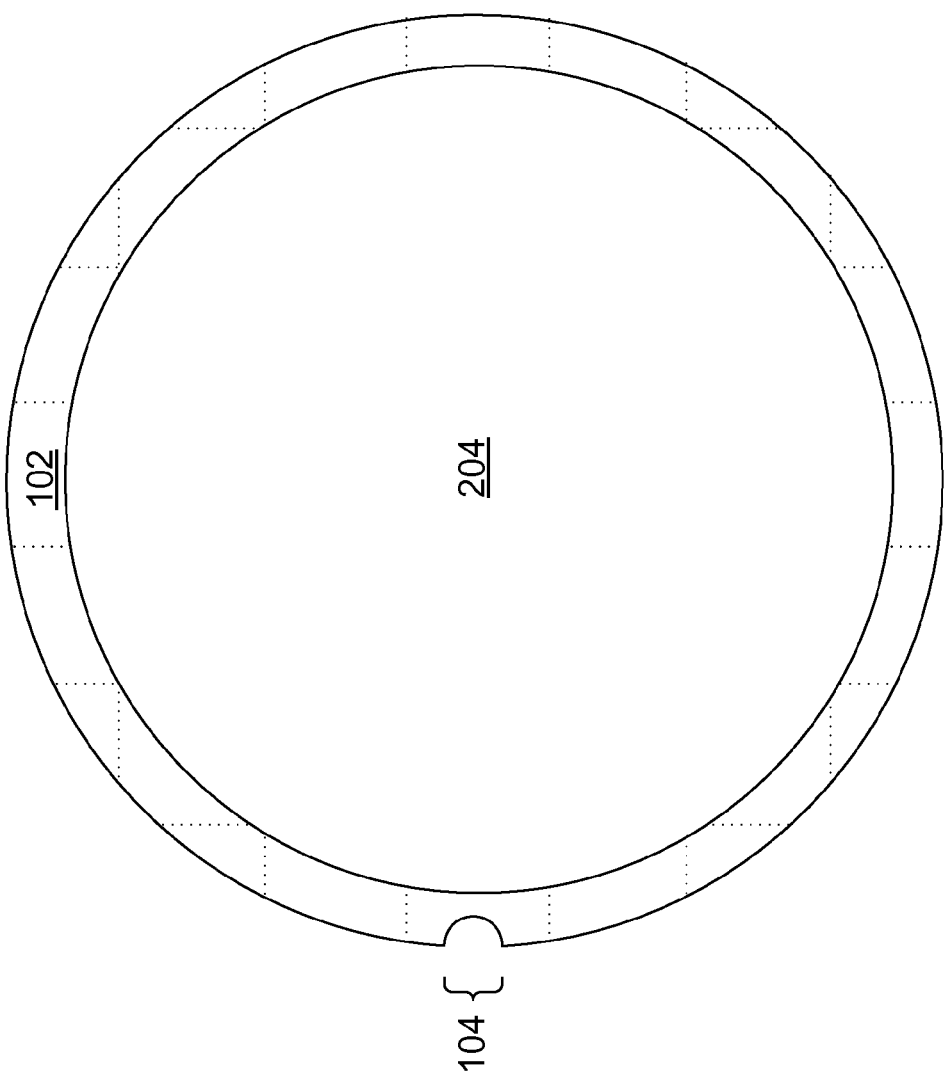

Referring now to FIGS. 2A-2B, a cross section view and a top view, respectively, illustrating forming a permeable layer 204 on the wafer 102 is shown. The permeable layer 204 may be formed initially over the wafer 102 either directly on the wafer 102 or with one or more intervening layers. For example, although not shown in FIGS. 2A-2B, the permeable layer 204 may be formed on a contact level containing one or more contacts, one or more insulating layers. The permeable layer 204 may be composed of a number of layers at least one of which is vulnerable to moisture absorption. Common permeable layers include carbon doped dielectric layers especially those with dielectric constant less than 3.2 and/or porous dielectric layers, for example but not by way of limitation, SiCO containing dielectric films.

After deposition of the permeable layer, 204, it may be removed from the outer edge of the wafer a distance $D_{220}$ from the outer edge of a wafer 102 to form two regions of the wafer; namely, an outer region 110 and an inner region 108. The distance $D_{220}$ may range from approximately 1.6 mm to approximately 3 mm and ranges therebetween, including for example and not by way of limitation, 1.8 mm to 2.0 mm, 2.0 mm to 2.5 mm, 2.5 to 3.0 mm, etc. In a preferred embodiment, the distance $D_{220}$ may be approximately 2.4 mm. It should be noted that the distance $D_{220}$ may be larger than it is in conventional chip fabrication techniques. Typically, the inner region 108 of the wafer 102 is maximized to increase the number of whole chips produced. This may result in a smaller distance (e.g., 1.5 mm) between an outer edge of conventional permeable layers and the outer edge of a wafer. As stated earlier, the permeable layer 204 may be deposited over the entire surface of the wafer 102. The permeable layer 204 may be removed from the outer region 110 by a litho-edge cut, also known as edge bead removal; thus it is a whole wafer process rather the a chip-mask level process.

Figure 3B:
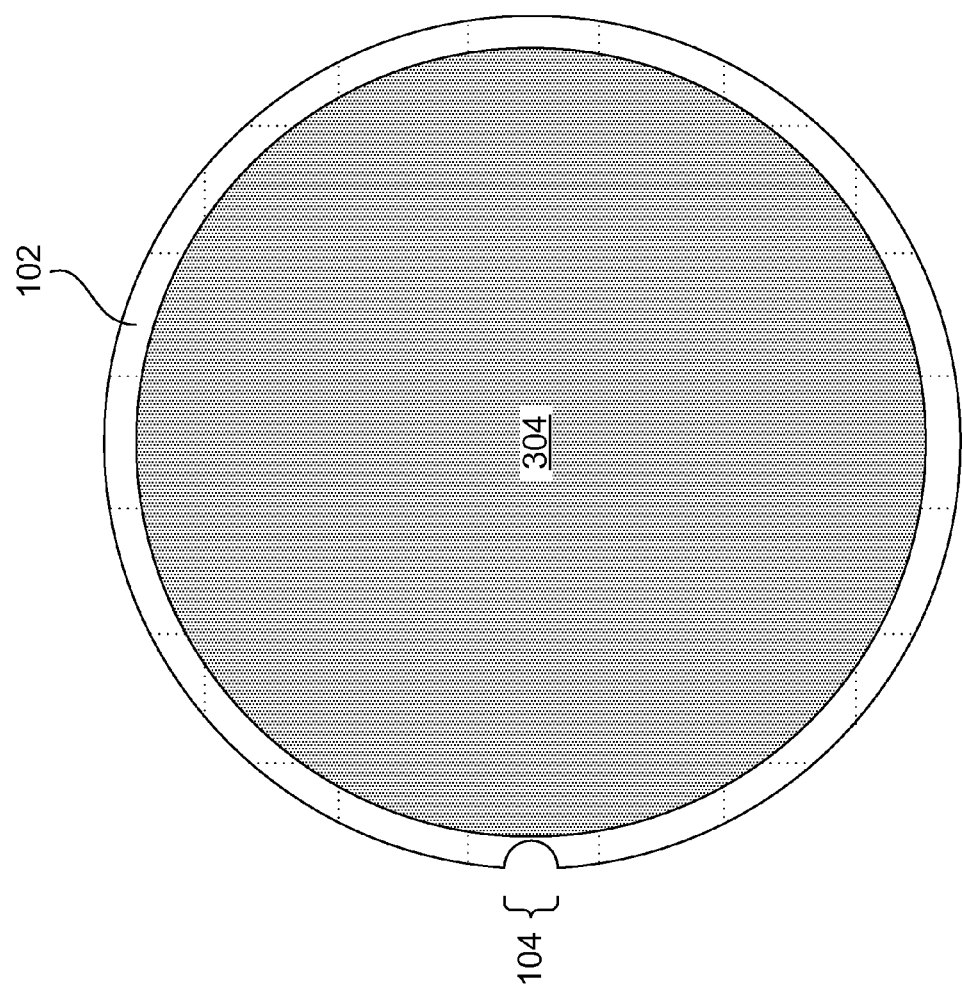

Referring now to FIGS. 3A-3B, a cross section view and a top view, respectively, illustrating forming a lower metal layer 304 on the permeable layer 204 and the wafer 102 is shown. The lower metal layer 304 may be formed by any metal deposition method known in the art, such as, for example, electroplating, electrophoretic deposition, underpotential deposition, electroless plating, chemical vapor deposition, physical vapor deposition, atomic layer deposition or combinations thereof. The lower metal layer 304 may be composed of a metal or a combination of metals that are, relative to permeable layer 204, impermeable to moisture. In a preferred embodiment, the lower metal layer 304 may be composed copper. One skilled in the art will appreciate, while not show in the figures, portions of the permeable layer 204 formed on the inner region 108 may be etched to form lines and/or via openings. In such embodiments, the openings (not shown) may be over-filled with the lower metal layer 304. In the outer region 110, the lower metal layer 304 may cover an outer side of the permeable layer 204 and may be in contact with an upper surface of the wafer 102. In conventional chip fabrication, a metal layer may not be formed until lower dielectric layers are formed on the wafer, and therefore the metal layer may not be in contact with the wafer 102, there may be intervening non-permeable layers between the lower metal layer 304 and the wafer 102.

Figure 4A:
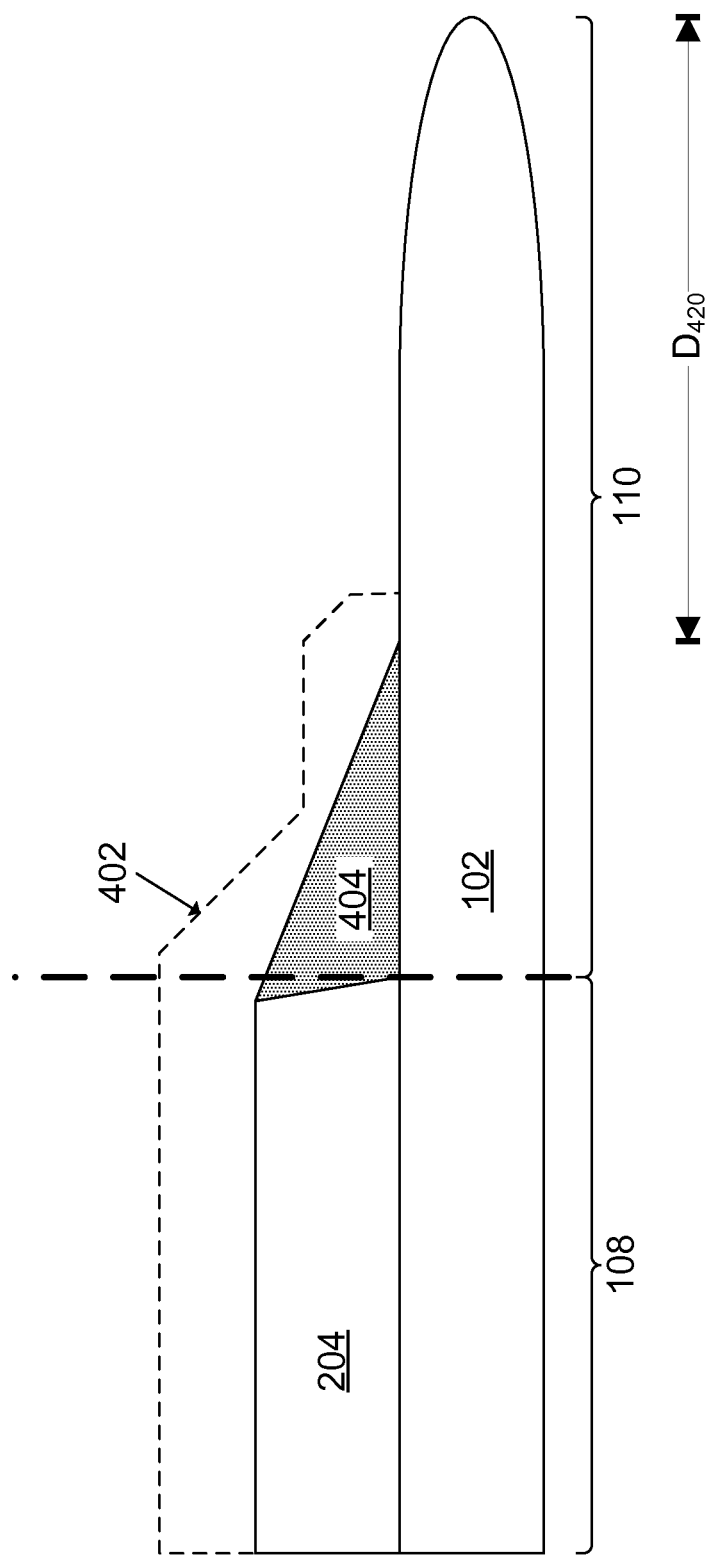
FIGS. 4A-4B are a cross section view and a top view, respectively, of forming a lower metal fillet, according to an embodiment of the present invention.
Figure 4B:
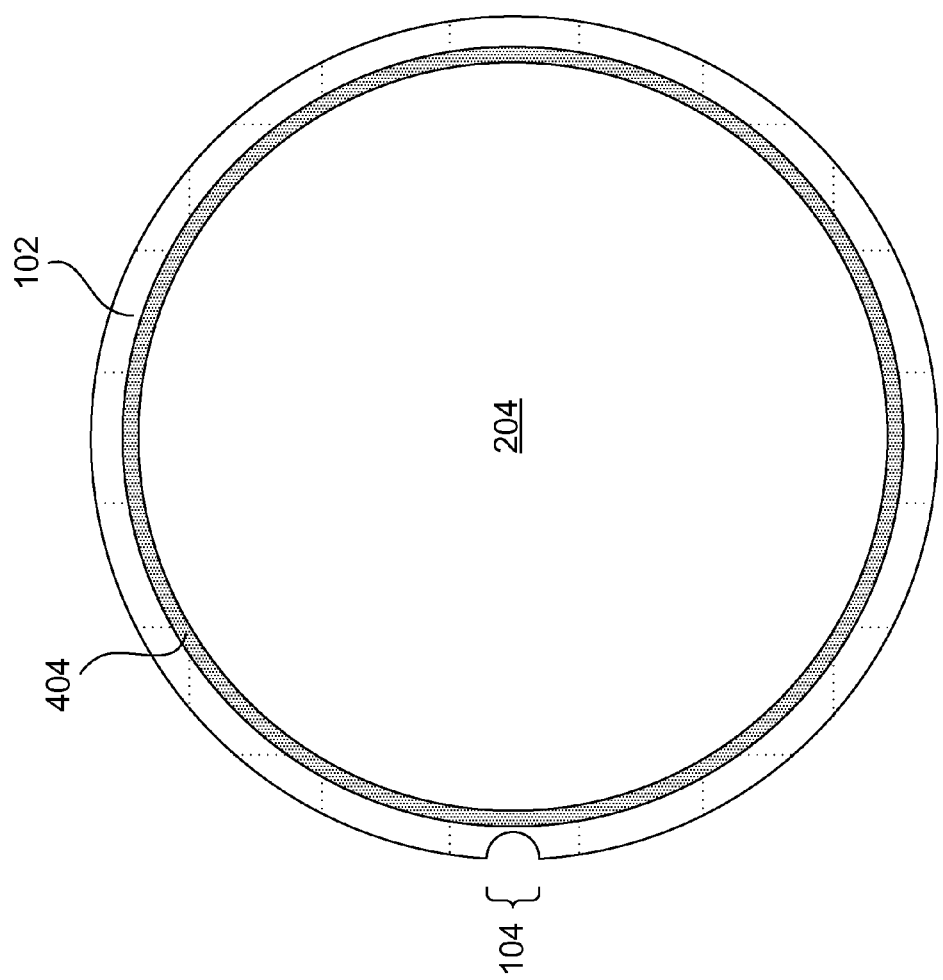

Referring now to FIGS. 4A-4B, a cross section view and a top view, respectively, illustrating removing a portion 402 of the lower metal layer 304 (FIG. 3B) to expose an upper surface of the permeable layer 204 and to form a lower metal fillet 404 is shown. In an embodiment, the portion 402 may be removed using a conventional planarization process, such as, for example, chemical mechanical planarization (CMP). The lower metal fillet 404 may have an inner side that is laterally adjacent to and in contact with the outer edge of the permeable layer 204. An outer edge of the lower metal fillet 404 may be a distance $D_{420}$ from the outer edge of the wafer 102, ranging from approximately 1.5 mm to approximately 2.5 mm. In a preferred embodiment, the distance $D_{420}$ may range from approximately 1.8 mm to approximately 2.2 mm, and ranges therebetween, for example and not by limitation, 1.8 mm to 2.0 mm, 2.0 to 2.1 mm, etc.

It should be noted that by enlarging the distance $D_{220}$ (FIG. 2A), a band of metal (i.e., the lower metal fillet 404) is allowed to build up on the wafer 102 outside the inner region 108 and at the same level as the permeable dielectric layer 204. Furthermore, the enlargement of the distance $D_{220}$ may allow the lower metal fillet 404 to be inside the wafer notch 104, if present, without intersecting the wafer notch 104. Although FIGS. 2A-4B depict the formation of only one permeable layer 204 and one lower metal fillet 404, embodiments that include the formation more than one permeable layer 204 and more than one lower metal fillet 404 formed above one another, are contemplated.

Figure 5A:
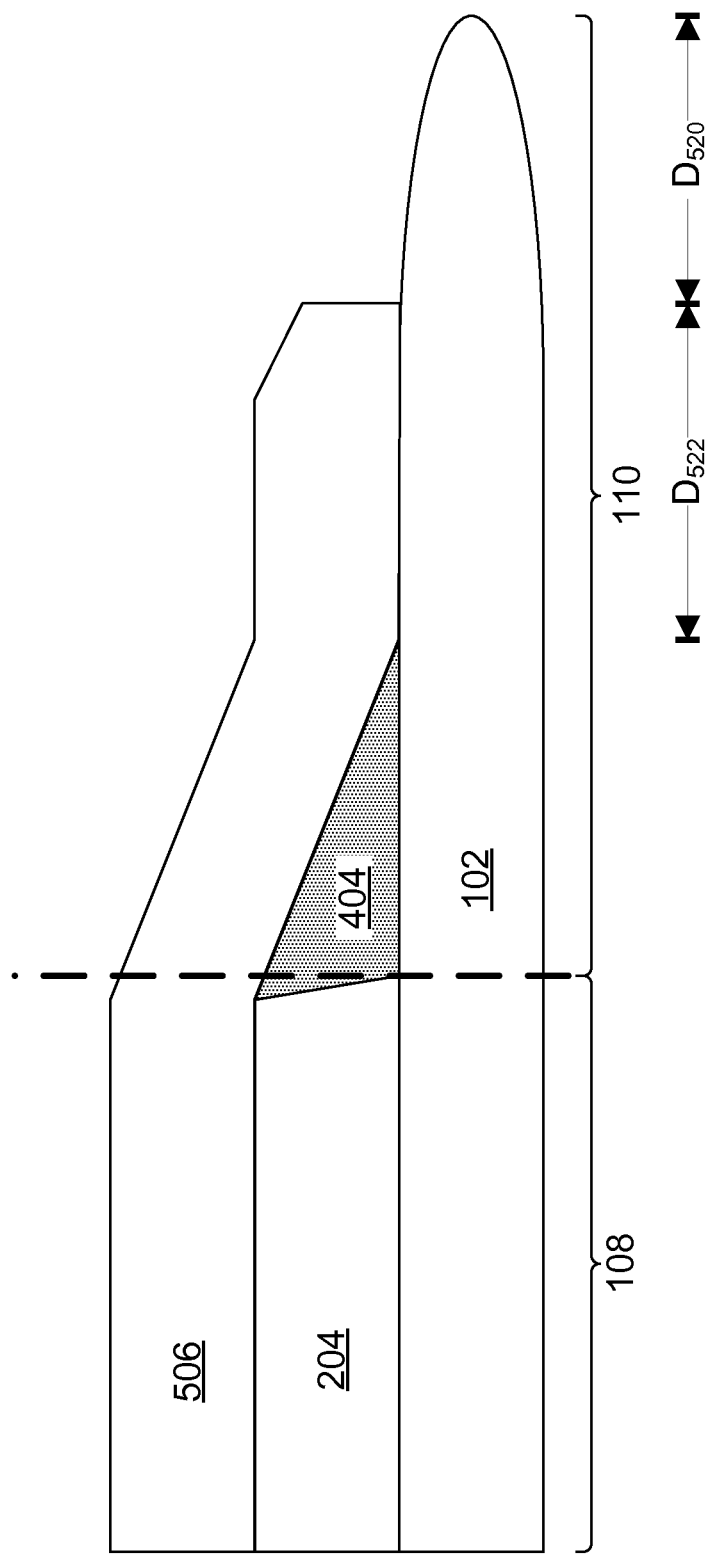
FIGS. 5A-5B are a cross section view and a top view, respectively, of forming a dielectric layer, according to an embodiment of the present invention.
Figure 5B:
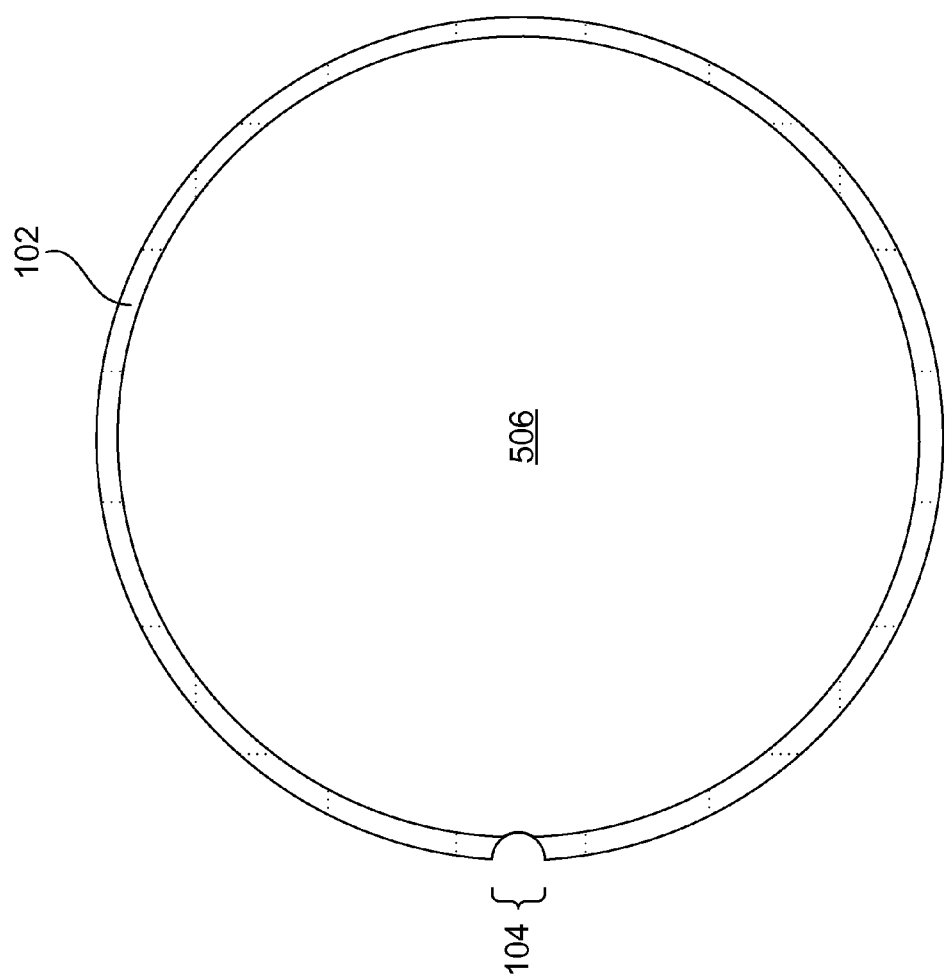

Referring now to FIGS. 5A-5B, a cross section view and a top view, respectively, illustrating forming a dielectric layer 506 over the permeable layer 204, the lower metal fillet 404, and a portion of the outer region 110 is shown. The dielectric layer 506 may be formed using any suitable deposition method known the art, including, for example, atomic layer deposition (ALD), chemical vapor deposition (CVD), plasma enhanced chemical vapor deposition (PECVD), spin-on techniques, molecular beam deposition (MBD), pulsed laser deposition (PLD), liquid source misted chemical deposition (LSMCD), or sputtering. The dielectric layer 506 may be composed of a dielectric material that is substantially non-permeable to moisture, such as, for example, (doped) silicon oxides, silicon nitride, silicon oxynitride, SiBCN, SiOCN, or a combination thereof. In a preferred embodiment, the dielectric layer 506 may be composed of silicon dioxide. Generally, non-permeable dielectric layers will have a dielectric constant greater than or equal to about 3.5.

In an embodiment, the dielectric layer 506 may have an outer edge that is formed by an edge bead removal/litho edge cut process. Accordingly, the dielectric layer 506 may have an outer edge that is a distance $D_{520}$ from the outer edge of the wafer 102. The distance $D_{520}$ may range from approximately 0.7 mm to approximately 1.3 mm and ranges therebetween for example and not by way of limitation, 0.7 mm to 0.9 mm, 0.9 mm to 1.1 mm, and 1.1 mm to 1.3 mm. In a preferred embodiment, the distance $D_{520}$ may be approximately 1 mm. In addition, the outer edge of the dielectric layer 506 may be a distance $D_{522}$ from the outer edge of the lower metal fillet 404. The distance $D_{522}$ may range from approximately 0.2 mm to approximately 1.5 mm and ranges therebetween, including for example and not by way of limitation 0.2 mm to 0.5 mm, 0.5 mm to 0.7 mm, 0.7 to 1.5 mm, etc. In a preferred embodiment, the distance $D_{522}$ may range from approximately 0.6 mm to approximately 1 mm and ranges therebetween, including for example and not by way of limitation 0.6 mm to 0.8 mm, 0.7 mm to 0.9 mm, 0.8 to 1 mm, etc. In an embodiment, the outer edge of the dielectric layer 506 may extend to intersect the wafer notch 104, if present.

Although not shown in FIGS. 5A-5B, one of the ordinary skill in the art would understand that lines, vias, and openings may be formed in portions of the dielectric layer 506 in the inner region 108. In an embodiment the lines, vias, and openings may be formed using a dual damascene process wherein the printing of vias is turned on in portions of the dielectric layer 506 in the product region 107 while printing of vias is turned off in portions of the dielectric layer 506 where there are partial chips, such as in the outer region 110. Vias, if turned on, as one skilled in the art would realize, would be in the lower portion of the dielectric layer 506 and would land on the underlying lower metal fillet 404 or the permeable layer 204. Turning off printing in an area, even over a partial chip region, is unusual because many processes are pattern factor dependent (for example, CMP and reactive ion etching), and thus printing is usually kept the same over all areas of a wafer 102. In embodiments of the present invention, it is turned off over partial chips to avoid the potential for unfilled or partially filled vias in the outer region 110 which may cause a break in the dielectric layer 506 and provide a path for moisture penetration. A single damascene embodiment is also contemplated.

Figure 6B:
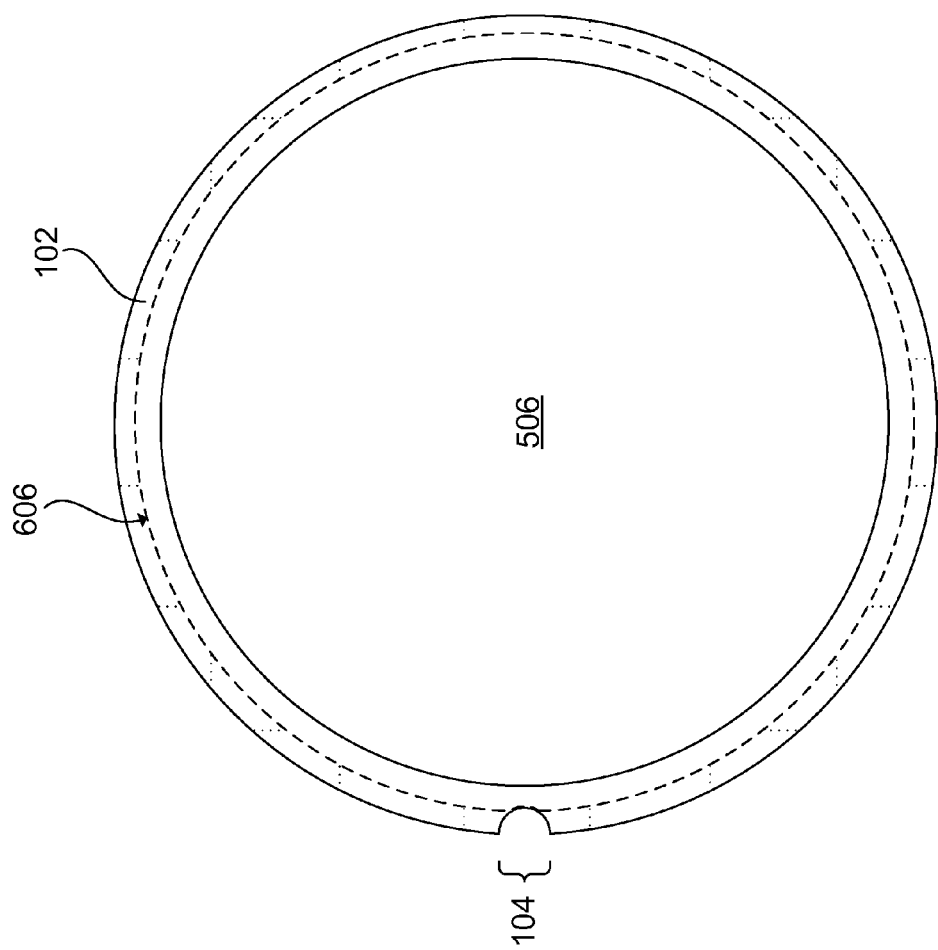

Referring now to FIGS. 6A-6B, a cross section view and a top view, respectively, illustrating removing a portion 606 from the dielectric layer 506 is shown. In an embodiment, the portion 606 may be removed using a conventional etching process, such as, for example, RIE. In addition, an edge bead removal process may be used to define a sidewall 608 of the dielectric layer 506 where the portion 606 is removed. An edge bead removal process may involve distributing a solvent through a fine needle at an outer edge of a rotating wafer to remove material near the edge of a whole wafer. It should be noted that in a preferred embodiment, the sidewall 608 is vertically aligned with the inner side of the lower metal fillet 404 (i.e., on the edge of the inner region 108) and is the distance $D_{220}$ (FIG. 2A) from the outer edge of the wafer 102. In an embodiment, the formation of the sidewall 608 may allow for a subsequently formed upper metal fillet will be vertically aligned over the lower metal fillet 404.

Figure 7A:
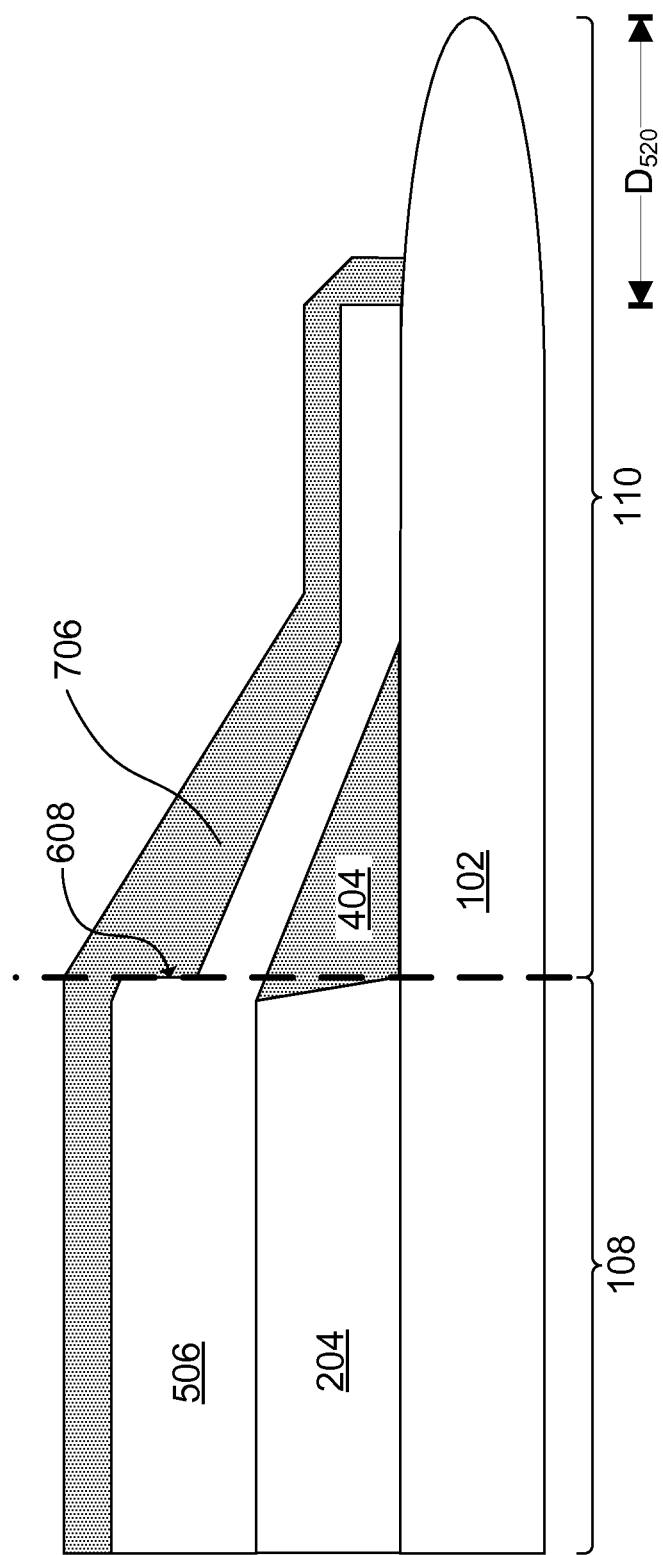
FIGS. 7A-7B are a cross section view and a top view, respectively, of forming an upper metal layer, according to an embodiment of the present invention.
Figure 7B:
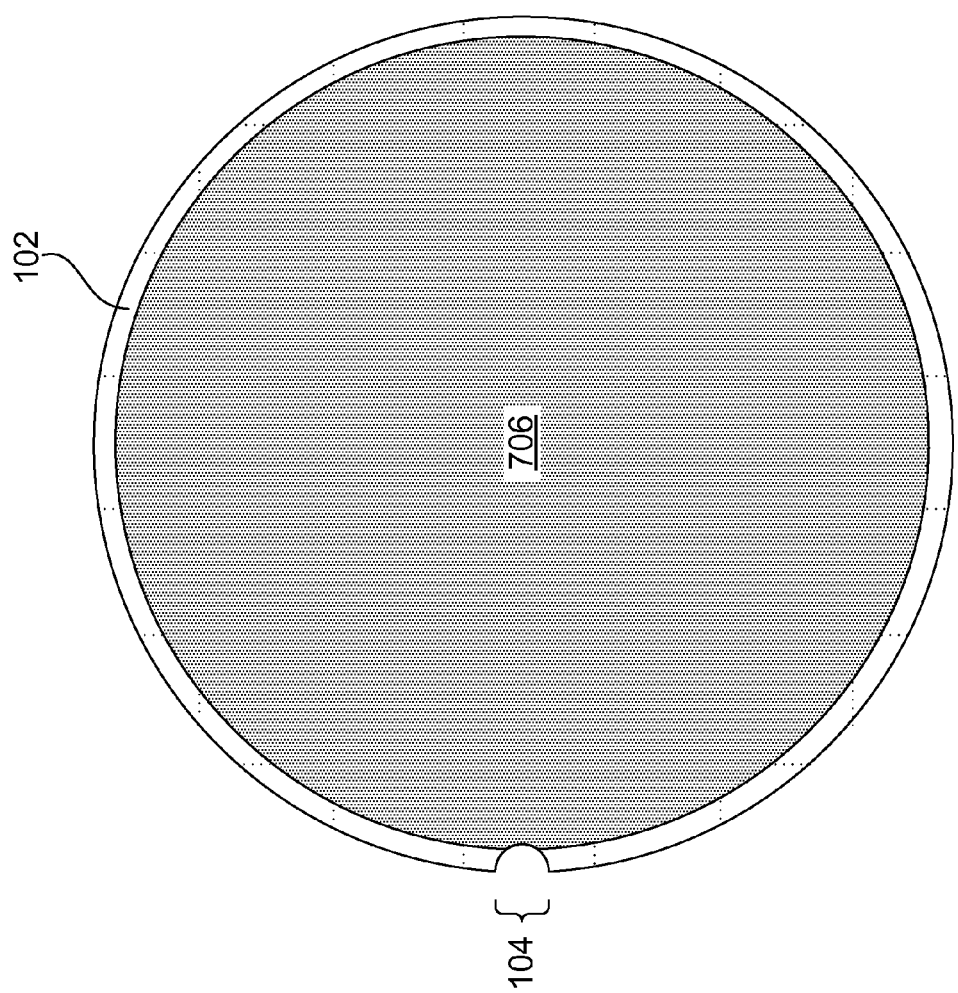

Referring now to FIGS. 7A-7B, a cross section view and a top view, respectively, illustrating forming an upper metal layer 706 on the dielectric layer 506 is shown. The upper metal layer 706 may be formed by any metal deposition method known in the art, such as, for example, those described in conjunction with lower metal layer 304. The upper metal layer 706 may be composed of a metal or a combination of metals that are impermeable to water. In a preferred embodiment, the upper metal layer 706 may be composed copper and may include copper liner layers (Ta/TaN, MnSiO, for example, but not by way of limitation) or capping layers. It should be noted that lower metal layer 304 also may include liner layers. In an embodiment, the upper metal layer 706 may cover the outer edge of the dielectric layer 506 and may extend to cover a portion of the wafer 102 in the outer region 110. The distance of an outer side of upper metal layer 706 and the edge of the wafer may be determined by the edge ring used during the deposition process of one of the metal layers.

Figure 8B:
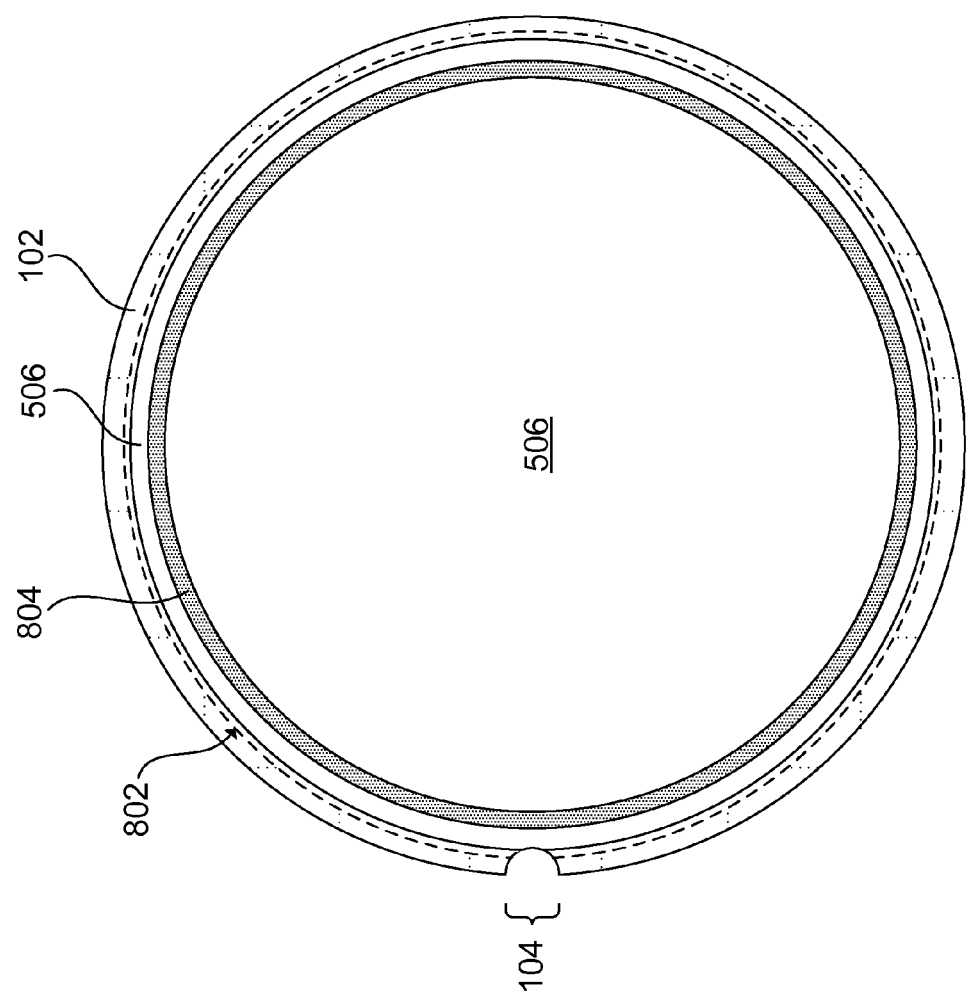

Referring now to FIGS. 8A-8B, a cross section view and a top view, respectively, illustrating removing a portion 802 of the upper metal layer 706 (FIG. 7A) to form an upper metal fillet 804 is shown. The portion 802 may be removed such that an upper surface of the dielectric layer 506 in the inner region 108 is exposed. The portion 802 may be removed by any method known in the art, such as, etching or a conventional planarization process, such as, for example, CMP. The upper metal fillet 804 may have an outer edge that is vertically aligned with the outer edge of the lower metal fillet 404. The upper metal fillet 804 may have an outer edge that is on the inner side of the wafer notch 104.

The upper metal fillet 804 may have an inner edge that is in contact with the sidewall 608 and vertically aligned with the inner edge of the lower metal fillet 404. The upper metal fillet 804 may have a width ranging from approximately 0.2 mm to approximately 1 mm and ranges therebetween, including for example and not by way of limitation 0.2 mm to 0.5 mm, 0.4 mm to 0.8 mm, 0.7 to 1 mm, etc.

Although FIGS. 5A-8B depict the formation of only one dielectric layer 506 and one upper metal fillet 804, embodiments that include the formation more than one dielectric layer 506 and more than one upper metal fillet 804, formed above one another, are contemplated.

Figure 9A:
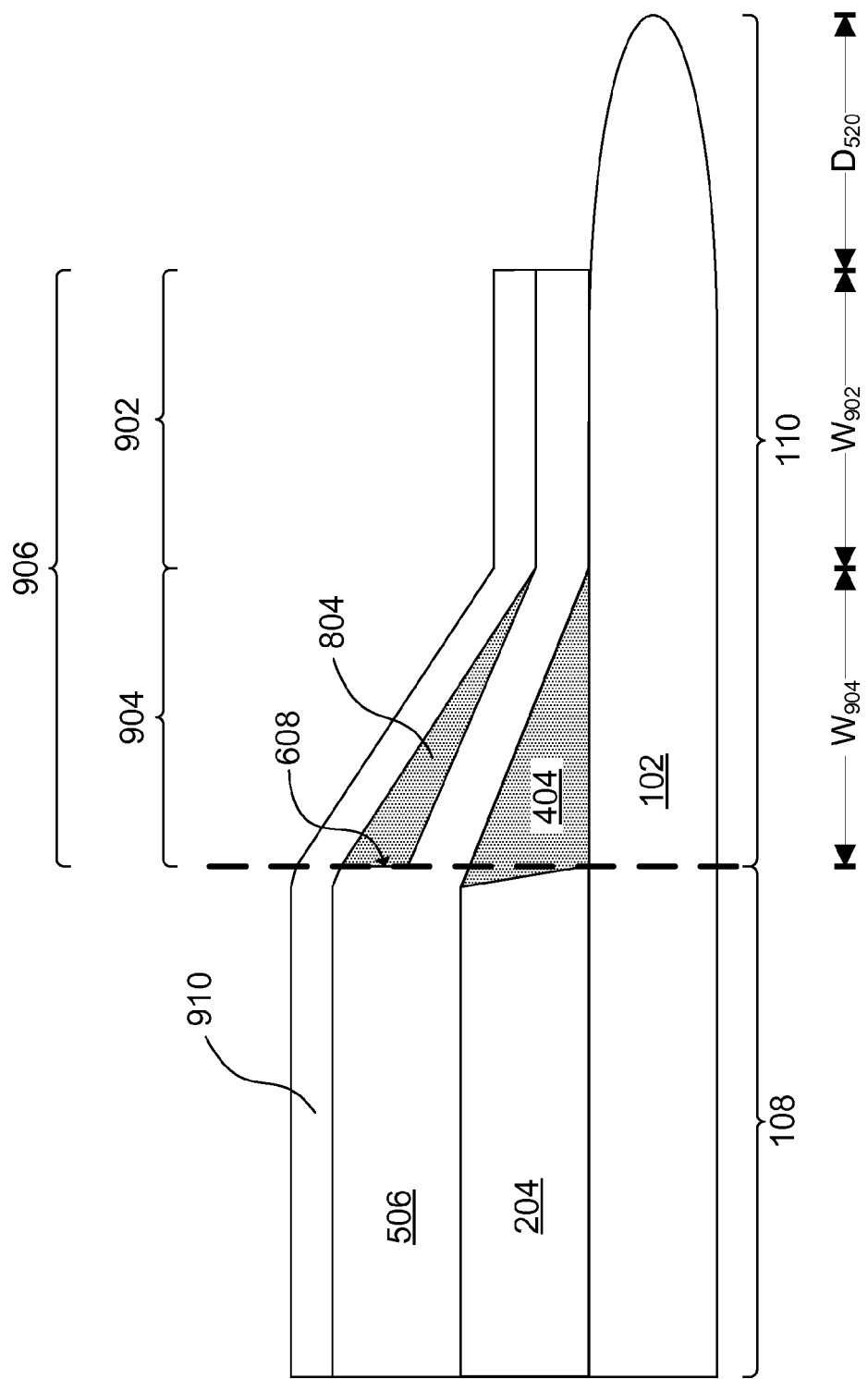
FIGS. 9A-9B are a cross section view and a top view, respectively, of forming a capping layer, according to an embodiment of the present invention.
Figure 9B:
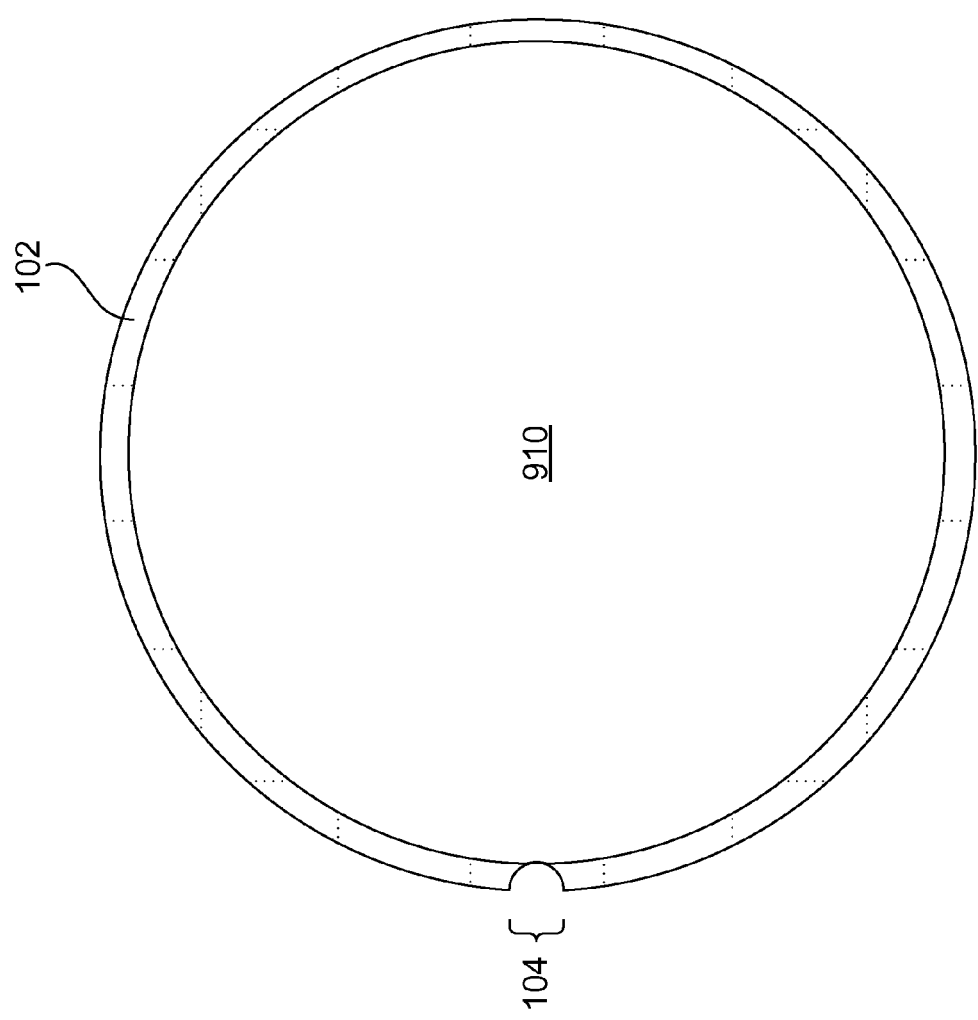

Referring now to FIGS. 9A-9B, a cross section view and a top view, respectively, illustrating forming a capping layer 910 on the dielectric layer 506 and the upper metal fillet 804 to form an edge seal 906 is shown. The capping layer 910 may comprise a dielectric material, such as, for example, silicon oxide, silicon nitride, silicon oxynitride, SiBCN, SiOCN, or a combination thereof. In a preferred embodiment, the capping layer 910 may comprise silicon dioxide. The capping layer 910 may be formed using any suitable deposition method known the art, including, for example, ALD, CVD, PECVD, spin-on techniques, MBD, PLD, LSMCD, or sputtering. In an embodiment, an edge bead removal process may be performed on the capping layer 910 such that an outer edge of the capping layer 910 is vertically aligned with the outer edge of the dielectric layer 506.

The edge seal 906 may protect wiring in the inner region 108 from moisture, and may prevent contaminants from leaking out from the structure. The edge seal 906 may be defined by two laterally adjacent regions, a dielectric extension region 902 closest to the edge of the wafer 102 and a fillet region 904 closest to the inner region 108. The dielectric extension region 902 may extend upwards from the device level of the wafer 102 and may include an outer portion of the dielectric layer 506 and an outer portion of the capping layer 910. Horizontally, the dielectric extension region 902 may be located between the fillet region 904 of the edge seal 906 and the distance $D_{520}$ (FIG. 5A) from the outer edge of the wafer 102. In embodiments in which the wafer 102 has the wafer notch 104, the dielectric extension region 902 may extend intersect the wafer notch 104 while the fillet region 904 preferably does not extend to the wafer notch 104.

The dielectric extension region 902 may have a width $W_{902}$ ranging from approximately 0.2 mm to approximately 1.5 mm and ranges therebetween, including for example and not by way of limitation 0.2 mm to 0.6 mm, 0.5 mm to 1.1 mm, 1 mm to 1.5 mm, etc. In a preferred embodiment, the width $W_{902}$ may range from approximately 0.6 mm to approximately 1 mm and ranges therebetween, including for example and not by way of limitation 0.6 mm to 0.8 mm, 0.7 mm to 0.9 mm, 0.8 mm to 1 mm, etc.

The fillet region 904 may extend upwards from the device layer of the wafer and may include the lower metal fillet 404, a middle portion of the dielectric layer 506, the upper metal fillet 804, and a middle portion of the capping layer 910. Horizontally, the fillet region 904 may be bordered on its inner side by the inner region 108 and on its outer side by the dielectric extension region 902. The fillet region 904 may include at least one lower metal fillet 404 on the wafer 102 whose inner side is laterally adjacent to and in contact with the permeable layer 204. In an embodiment, an outermost side of the fillet region 904 is the distance $D_{420}$ (FIG. 4A) from the outer edge of the wafer 102. The fillet region 904 may have a width $W_{904}$, ranging from approximately 0.2 mm to approximately 1 mm and ranges therebetween, including for example and not by way of limitation 0.2 mm to 0.5 mm, 0.4 mm to 0.8 mm, 0.7 mm to 1 mm, etc. In a preferred embodiment, the width $W_{904}$ may range from approximately 0.5 mm to approximately 0.7 mm.

The deposition of the capping layer 910 may also complete the formation of the inner region 108. The completed inner region 108 may extend upwards from the device layer of the wafer 102 in the inner region 108 and may include the permeable layer 204, an inner portion of the dielectric layer 506, and an inner portion of the capping layer 910.

Embodiments of the present invention provide a structure and method of forming an edge seal around a perimeter of a whole wafer that may more effectively protect an entire product region of the whole wafer from moisture than conventional chip sealing technology, which typically only provides a moisture barrier around individual whole chips. The edge seal may be formed around a perimeter of a wafer and may encircle a plurality of whole chips. In an embodiment, a permeable layer may be formed over the entire product region (i.e, whole chips) and may have an outer edge that is a substantial distance from the edge of the wafer to allow space for a fillet region and a dielectric extension region. In an embodiment, the dielectric extension region may extend into a wafer notch, while the fillet region may be separated from the wafer notch by a distance. The fillet region and the dielectric extension region may collectively form an edge seal adjacent to the permeable layer that creates a highly moisture resistant seal. By creating an edge pattern with extended termination dimensions and an innovative patterning plan, a robust seal may be created around the entire wafer periphery.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An edge seal structure encircling a product region and located at a perimeter of a wafer, the edge seal structure comprising:
    a permeable layer on a product area of the wafer, wherein an outer edge of the permeable layer is spaced a first distance from an outer edge of the wafer;
    a lower metal fillet on the wafer laterally adjacent to an in contact with the permeable layer, wherein an outer edge of the lower metal fillet is spaced a second distance from the outer edge of the wafer, wherein the second distance is smaller than the first distance;
    a non-permeable dielectric layer on the permeable layer, on the lower metal fillet, and on an outer region of the wafer adjacent to the lower metal fillet, wherein an outer edge of the dielectric layer is spaced a third distance from the outer edge of the wafer, and wherein the third distance is smaller than the second distance;
    an upper metal fillet on the dielectric layer, wherein an outer edge of the upper metal fillet is vertically aligned with an outer edge of the lower metal fillet such that the outer edge the upper metal fillet is the second distance from the outer edge of the wafer; and
    a capping layer on the dielectric layer and the upper metal fillet, wherein the capping layer has an outer edge that is vertically aligned with the outer edge of the dielectric layer such that the outer edge of the capping layer is the third distance from the outer edge of the wafer.

2. The structure of claim 1, wherein the first distance ranges from approximately 1.6 mm to approximately 3 mm.

3. The structure of claim 1, wherein the second distance ranges from approximately 1.5 mm to approximately 2.5 mm.

4. The structure of claim 1, wherein the third distance ranges from approximately 0.7 mm to approximately 1.3 mm.

5. The structure of claim 1, wherein the dielectric layer comprises silicon oxide.

6. The structure of claim 1, wherein the lower metal fillet and the upper metal fillet comprise copper.

7. The structure of claim 1, wherein the capping layer comprises silicon oxide.

* * * * *